United States Patent
Won et al.

(10) Patent No.: US 7,214,600 B2
(45) Date of Patent: May 8, 2007

(54) METHOD TO IMPROVE TRANSMITTANCE OF AN ENCAPSULATING FILM

(75) Inventors: Tae Kyung Won, San Jose, CA (US); Sanjay Yadav, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 92 days.

(21) Appl. No.: 11/229,015

(22) Filed: Sep. 15, 2005

(65) Prior Publication Data

US 2006/0078677 A1    Apr. 13, 2006

Related U.S. Application Data

(63) Continuation-in-part of application No. 11/133,130, filed on May 18, 2005, now Pat. No. 7,183,197, which is a continuation-in-part of application No. 10/876,440, filed on Jun. 25, 2004.

(51) Int. Cl.
      *H01L 21/20*    (2006.01)
(52) U.S. Cl. ........................ 438/485; 427/579
(58) Field of Classification Search ................ 438/475, 438/485, 788, 791, 792, 902, 775–777; 257/E51.018, 257/E51.022, E51.026; 437/533, 536, 579, 437/255.23, 255.394, 255.18, 376.2, 397.7
See application file for complete search history.

(56) References Cited

U.S. PATENT DOCUMENTS

| | | | |
|---|---|---|---|
| 4,863,755 A * | 9/1989 | Hess et al. | 427/574 |
| 5,399,387 A | 3/1995 | Law et al. | |
| 5,438,222 A | 8/1995 | Yamazaki et al. | |
| 5,593,741 A | 1/1997 | Ikeda et al. | |
| 5,733,610 A | 3/1998 | Okazaki et al. | |
| 6,055,927 A | 5/2000 | Shang et al. | |
| 6,337,102 B1 | 1/2002 | Forrest et al. | |
| 6,506,691 B2 | 1/2003 | Cook et al. | |
| 6,645,884 B1 | 11/2003 | Yang | |
| 6,699,739 B2 | 3/2004 | Yamazaki et al. | |
| 6,710,542 B2 | 3/2004 | Chun et al. | |
| 6,770,562 B2 | 8/2004 | Yamazaki et al. | |
| 6,791,129 B2 | 9/2004 | Inukai | |
| 6,991,859 B2 | 1/2006 | Klubek et al. | |
| 7,074,640 B2 | 7/2006 | Maloney et al. | |
| 2003/0159656 A1 | 8/2003 | Tan et al. | |
| 2004/0113542 A1 | 6/2004 | Hsaio et al. | |
| 2004/0262613 A1 | 12/2004 | Maekawa et al. | |
| 2006/0158101 A1 | 7/2006 | Camilletti et al. | |

FOREIGN PATENT DOCUMENTS

| | | |
|---|---|---|
| EP | 1 365 389 A | 11/2003 |
| JP | 61218135 | 9/1986 |
| JP | 2003197636 | 7/2003 |
| WO | WO 00/15869 A | 3/2000 |

OTHER PUBLICATIONS

Huang et al., "Low Temperature PECBD $SiN_x$ Films Applied in OLED Packaging", *Materials Science and Engineering B98* (2003) 248-254.

(Continued)

*Primary Examiner*—David Vu
(74) *Attorney, Agent, or Firm*—Patterson & Sheridan LLP

(57) ABSTRACT

A method for depositing a carbon-containing material layer onto a substrate includes delivering a mixture of precursors for the carbon-containing material layer into a process chamber, doping the carbon-containing material layer with silicon, and depositing the carbon-containing material layer at low temperature. In one aspect, improved light transmittance of the carbon-containing material layer at all wavelengths of a visible light spectrum is obtained. In addition, a method for depositing an encapsulating layer is provided for various display applications which require low temperature deposition process due to thermal instability of underlying materials used. The encapsulating layer may include one or more barrier layer material layers and one or more amorphous carbon material layers. The amorphous carbon material can be used to reduce thermal stress and prevent the deposited thin film from peeling off the substrate.

35 Claims, 8 Drawing Sheets

OTHER PUBLICATIONS

Kathleen M. Vaeth, "OLED-Display Technology", *Information Display*, Jun. 2003, pp. 12-17.

Tao Peng et al., "Silicon Nitride Thin Films Packaging for Flexible Organic Light Emitting Devices", *International Journal of Modern Physics B*, vol. 16, Nos. 6 & 7 (2002) pp. 1052-1056.

P.E. Burrows et al., "Gas Permeation and Lifetime Tests on Polymer-Based Barrier Coatings" *SPIE Annual Meeting, Invited Paper*, Aug. 30, 2000, pp. 1-9.

Nakayama et al., "Physical Properties of diamondlike carbon films deposited in mixed atmospheres of $C_2H_4$—Ar, $C_2H_4$—$H_2$, and $C_2H_4$—$N_2$", *J. Vac. Sci. Technol.* (1996) 2418-2426.

Ronald M. Kubacki, "Low Temperature Plasma Deposition of Silicon Nitride to Produce Ultra-Reliable, High Performance, Low Cost Sealed Chip-on-Board (SCOB) Assemblies", IEEE/CPMT Intl Electronics Manufacturing Technology Symposium 1994, pp. 273-280.

Yoshimi et al., "Amorphous Carbon Basis Blue Light Electroluminescent Device", *Optoelectronics Devices and Technologies, Mita Press*, vol. 7, Nos. 1 Jun. 1992, pp. 69-81.

International Search Report dated Dec. 20, 2005 for corresponding PCT application, PCT/US2005/020079.

* cited by examiner

METHOD TO IMPROVE TRANSMITTANCE OF AN ENCAPSULATING FILM

CROSS-REFERENCE TO RELATED APPLICATIONS

This application is a continuation-in-part of co-pending U.S. patent application Ser. No. 11/133,130, titled "Improving Water Barrier performance of an Encapsulating Film" (AMAT/8838.P1), filed May 18, 2005 now U.S. Pat. No. 7,183,197, which is a continuation-in-part of co-pending U.S. patent application Ser. No. 10/876,440, titled "Method to improve water-barrier performance by changing film surface morphology" (AMAT/8838), filed Jun. 25, 2004. The aforementioned related patent applications are herein incorporated by reference.

BACKGROUND OF THE INVENTION

1. Field of the Invention

Embodiments of the present invention generally relate to the deposition of thin films using chemical vapor deposition processing. More particularly, this invention relates to a process for depositing thin films onto large area substrates.

2. Description of the Related Art

Organic light emitting diode (OLED) displays have gained significant interest recently in display applications in view of their faster response times, larger viewing angles, higher contrast, lighter weight, lower power and amenability to flexible substrates, as compared to liquid crystal displays (LCD). Practical application of OLED is enabled by, as shown in FIG. 1, using layers of organic materials 103 sandwiched between two electrodes 102, 104 and built on a substrate 101. For example, two organic layers, in contrast to the old single organic layer, including one layer capable of monopolar (hole) transport and the other layer for electroluminescence can be used together with an anode layer and a cathode layer to lower the required operating voltage for OLED display. The cathode layer generally includes a metallic material and the anode layer may include a transparent material, such as an indium tin oxide (ITO) material, to be disposed on the bottom next to the substrate or on top of the OLED device for emitting light in a top emission device or a bottom emission device, respectively. Organic thin film transistor (TFT) device, active matrix devices, and other devices may also include additional structure, such as a TFT structure.

Over the years, layers in display devices have evolved into multiple layers with each layer serving different function. For example, a stack of organic layers could comprise a hole-injection layer, a hole-transport layer, an emissive layer, an electron-transport layer, and an electron injection layer. It should be noted that not all the above five layers of organic layers are needed to build an OLED cell. For example, in some cases, only a hole-transport layer and an emissive layer are needed. When an appropriate voltage (typically a few volts) is applied to the cell, the injected positive and negative charges recombine in the emissive layer to produce light (electroluminescence). The structure of the organic layers and the choice of the anode and cathode layers are designed to maximize the recombination process in the emissive layer, thus maximizing the light output from the OLED devices.

Many polymer materials, in addition to organic materials used in OLED, are also developed for small molecule, flexible organic light emitting diode (FOLED) and polymer light emitting diode (PLED) displays. Many of these organic and polymer materials are flexible for the fabrication of complex, multi-layer devices on a range of substrates, making them ideal for various transparent multi-color display applications, such as thin flat panel display (FPD), flexible displays, electrically pumped organic laser, and organic optical amplifier. The lifetime of display devices can be limited, characterized by a decrease in EL efficiency and an increase in drive voltage, due to the degradation of organic or polymer materials, the formation of non-emissive dark spots, and crystallization of the organic layers at high temperature of about 55° C. or higher, e.g., crystallization of the hole transport materials. Therefore, a low temperature deposition process for these materials, such as at about 100° C. or lower is needed.

In addition, the main reason for the material degradation and dark spot problems is moisture and oxygen ingress. For example, exposure to humid atmospheres is found to induce the formation of crystalline structures of 8-hydroxyquinoline aluminum ($Alq_3$), which is often used as the emissive layer, resulting in cathode delamination, and hence, creating non-emissive dark spots growing larger in time. In addition, exposure to air or oxygen may cause cathode oxidation and once organic material reacts with water or oxygen, the organic material is dead. Currently, most display manufacturers use metal-can or glass-can materials as an encapsulation layer to protect organic materials in the device from water ($H_2O$) or oxygen ($O_2$) attack. The metal or glass materials are attached to the substrate like a lid using a bead of UV-curved epoxy. However, moisture can easily penetrate through the epoxy and damage the device.

Other materials, such as inorganic materials, e.g., silicon nitride (SiN), silicon oxynitride (SiON) and silicon oxide (SiO), prepared by plasma enhanced chemical vapor deposition (PECVD), can also be used as an effective encapsulation/barrier layer against moisture, air and corrosive ions for such devices. For example, as shown in FIG. 1, an encapsulation/barrier layer 105 is deposited on top of the substrate 101 to protect the electrodes 102, 104 and the organic materials 103 underneath. However, it is very difficult to generate water-barrier inorganic encapsulation materials using a low temperature deposition process because the resulting film is less dense and has high defect pinhole structures. It is important to note that the presence of residual moisture in the organic layers may also promote the $Alq_3$ crystallization process even in encapsulated devices. In addition, oxygen and humidity being trapped during encapsulation and infiltrating into the OLED device to be in contact with the cathode and organic materials generally result in dark spot formation, which is a frequent OLED destroying defect. Therefore, a good encapsulation/barrier film also requires low water vapor transmission rate (WVTR).

Other problems also arise when thin film inorganic silicon nitride (SiN) related materials are used as the encapsulation/barrier layer. When the encapsulating layer is deposited to be thick to serve as a good oxygen and water barrier, it is usually hard, fragile, and too thick to adhere well to a substrate surface, resulting in cracking or peeling off the substrate surface, especially at high temperature and humidity stressed conditions. If the encapsulating layer is made thin to improve adhesion and thermal stability, it is not thick enough as a moisture barrier. Thus, additional stress relieving layers or other manipulation may be required. For example, we have previously used one or more low dielectric constant material layers alternating with one or more inorganic encapsulation/barrier layers to improve water-barrier and thermal stress performance and protect the devices underneath. However, despite having good water-barrier performance, the low dielectric constant materials are not very transparent and light transmittance is worse when multiple layers are used. As such, alternating layers of low dielectric constant materials are not compatible for some applications that require light emitting through the encapsulation multilayer. FIG. 2 demonstrates a direct correlation between light transmitted in a visible light spectrum and different thicknesses of low dielectric constant material films. With lines 240 representing the thickest film and line 210 representing the thinnest film, the transmittance of the four dielectric constant material films are especially poor at lower wavelengths for lines 210, 220, 230, 240, which will directly affect the quality of light emission at these wavelengths, leading to bad color display.

Thus, there is still a need for methods of depositing multiple layers of stress relieving materials and encapsulation/barrier materials with improved transmittance onto large area substrate.

SUMMARY OF THE INVENTION

Embodiments of the invention generally provide a method and apparatus for depositing an encapsulating film onto a substrate. In one embodiment, a method for forming a multilayer encapsulating film onto a substrate placed in a substrate processing system includes depositing a plurality of silicon-containing inorganic barrier layers onto the surface of the substrate by delivering a first silicon-containing compound into the substrate processing system. The method further comprises depositing one or more carbon-containing material layers in between and/or alternating with the one or more silicon-containing inorganic barrier layers at a substrate temperature of about 200° C. or lower by delivering a mixture of precursors comprising a carbon-containing compound, a second silicon-containing compound, and a nitrogen-containing compound into the substrate processing system.

In another embodiment, a method for forming an amorphous carbon layer in a multilayer encapsulating film over a substrate within a substrate processing system includes delivering a hydrocarbon-containing precursor for the amorphous carbon layer, delivering a hydrogen gas adapted to improve the film uniformity of the amorphous carbon layer into the substrate processing system, and delivering a silicon-containing precursor and a nitrogen-containing precursor adapted to improve the light transmittance of the amorphous carbon layer to about 80% or higher at all wavelengths of a visible light spectrum into the substrate processing system. The method further includes controlling the temperature of the substrate to a temperature of about 150° C. or lower, generating a plasma to deposit the amorphous carbon layer on the surface of the substrate, and depositing the amorphous carbon layer onto the substrate until a desired thickness of the amorphous carbon layer is obtained.

In yet another embodiment, a method for depositing an encapsulating layer, having one or more layers of silicon-containing inorganic barrier materials and carbon-containing materials, onto a substrate in a substrate processing system is provided. The method includes delivering a first mixture of precursors for a silicon-containing inorganic barrier layer, delivering a hydrogen gas into the substrate processing system, controlling the temperature of the substrate to a temperature of about 150° C. or lower, and generating a plasma to deposit the silicon-containing inorganic barrier layer on the surface of the substrate. The method further includes delivering a second mixture of precursors for a carbon-containing material layer, delivering a hydrogen gas into the substrate processing system, controlling the temperature of the substrate to a temperature of about 150° C. or lower, and generating a plasma to deposit the carbon-containing material layer onto the surface of the silicon-containing inorganic barrier layer. The second mixture of precursors comprises a hydrocarbon-containing precursor, a silicon-containing precursor, and a nitrogen-containing precursor. The encapsulating layer is deposited onto the substrate until a thickness of the encapsulating layer of about 15,000 angstroms or more is obtained.

In still another embodiment, a method for forming an amorphous carbon layer in a multilayer encapsulating film over a substrate within a substrate processing system includes delivering a hydrocarbon-containing precursor at a first flow rate for the amorphous carbon layer and delivering a hydrogen gas adapted to improve the film uniformity of the amorphous carbon layer into the substrate processing system. The method further includes delivering a silicon-containing precursor at a second flow rate and a nitrogen-containing precursor at a third flow rate into the substrate processing system, controlling the temperature of the substrate to a temperature of about 150° C. or lower, and generating a plasma inside the substrate processing system for a time period, wherein the ratio of the first flow rate and the second flow rate is 4:1 or larger in order to deposit the amorphous carbon layer on the surface of the substrate and dope the amorphous carbon layer with silicon.

In still another embodiment, an apparatus to deposit a low temperature material layer onto a substrate is also provided. The apparatus includes, a substrate support disposed in a process chamber to support a substrate, such as a large area substrate, a RF source coupled to the process chamber to provide a plasma inside the process chamber, a silicon-containing compound supply source coupled to the process chamber, one or more nitrogen-containing compound supply sources coupled to the process chamber, a hydrogen gas supply source coupled to the process chamber, a carbon-containing compound supply source coupled to the process chamber, and a controller coupled to the process chamber to control the temperature of the substrate to about 200° C. or lower during substrate processing and adapted to deposit an encapsulating layer having one or more carbon-containing material layers in between one or more silicon-containing inorganic barrier layers.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention generally relates to a method of improving water-barrier and thermal stability performance between a substrate and a film/layer deposited thereon. The invention describes using a hydrogen gas to reduce film surface roughness, resulting in smooth film surface and high level of film uniformity on a substrate surface. The smooth surface of the deposited film further prevents water and oxygen penetrating from atmosphere into the film and shows much lower WVTR (Water Vapor Transmission Rate) value. WVTR is a key parameter to indicate water-barrier performance in the Flat Panel Display (FPD) industry. Further, the invention provides a method and apparatus to deposit an encapsulating/barrier layer on the surface of a substrate, such as a display device, to greatly enhance/lengthen the lifetime of the device.

Figure 1:
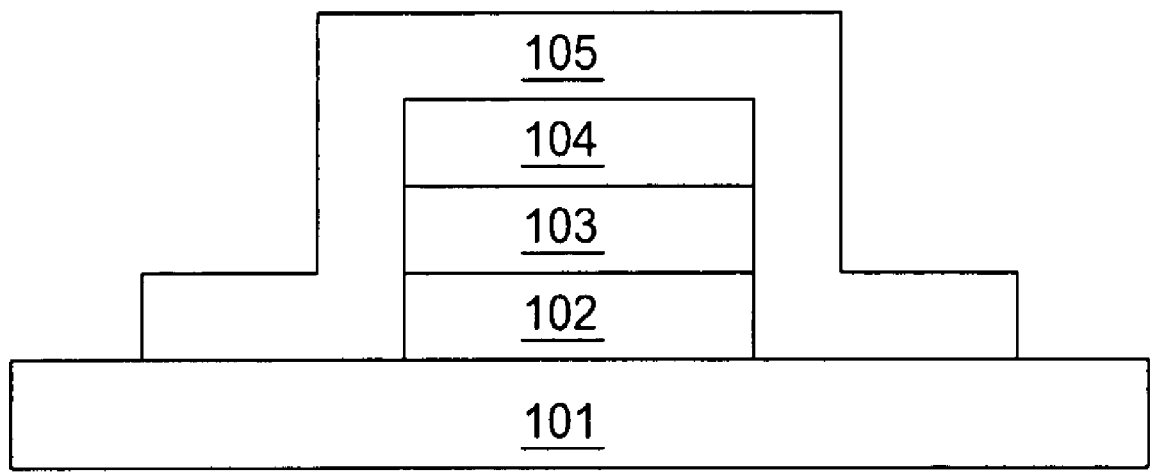
FIG. 1 depicts a cross-sectional schematic view of an OLED device with an encapsulating layer deposited on top.
Figure 2:
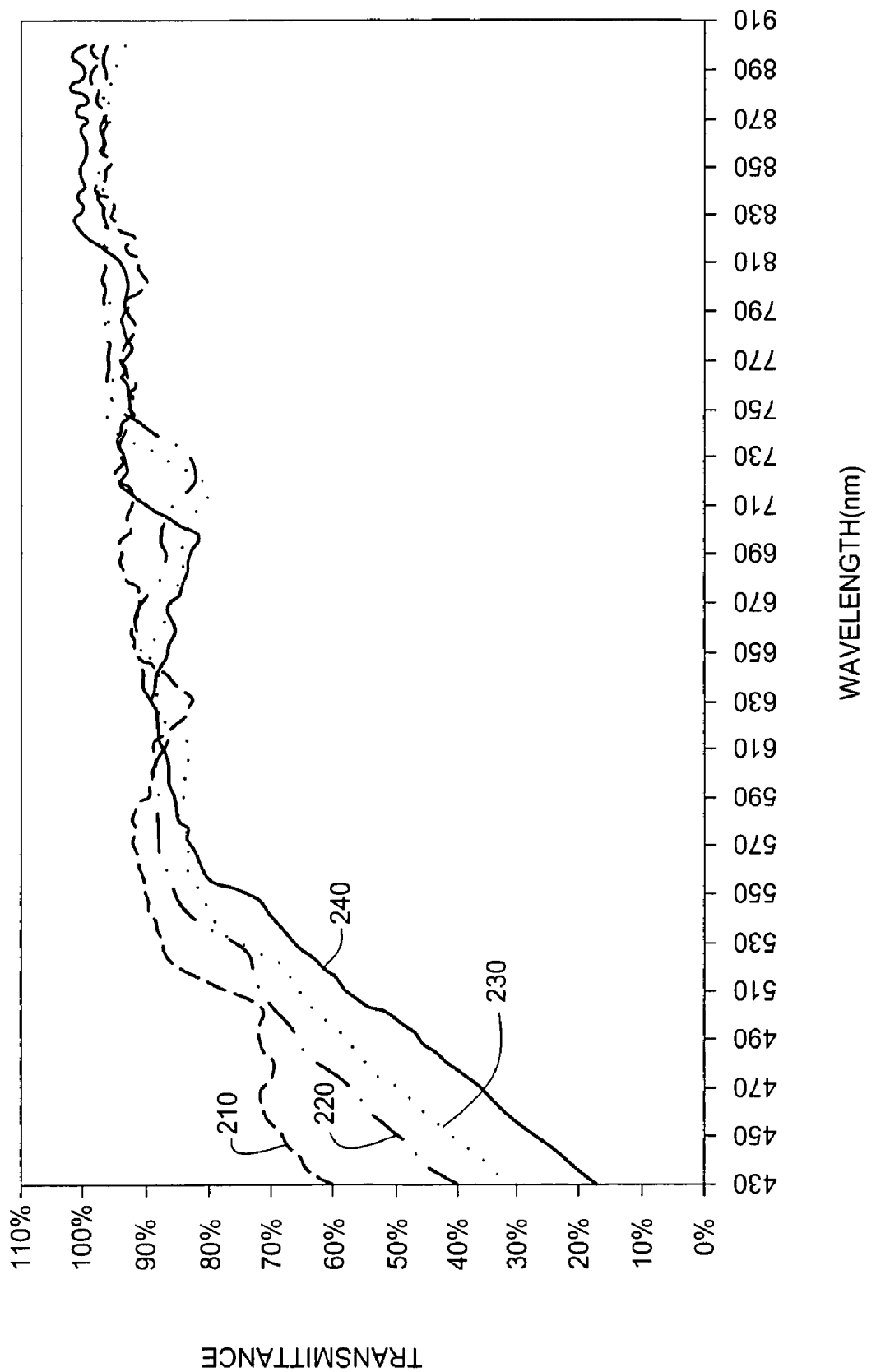
FIG. 2 is a graph showing the effect of the thickness of a low k material layer on transmittance at different wavelengths of the visible light.

In addition, the invention describes a method of depositing a carbon-containing material layer at a low temperature, such as about 200° C. or lower, onto a large area substrate surface and overcomes the low light transmittance observed at lower wavelengths of between 430 nm and 570 nm as shown in FIG. 2. The invention thus provides increased light transmittance of the carbon-containing material layer to about 80% or higher at all wavelengths in the visible light spectrum, such as between 400 nm to 900 nm.

The carbon-containing material layer can be an amorphous carbon material, a silicon-doped carbon material, a diamond-like-carbon material, carbon-doped silicon containing material, among others. The carbon-containing material and/or amorphous carbon material can be used as portions of an encapsulating layer to improve film uniformity, film adhesion, and thermal stability of the encapsulating layer. Accordingly, one or more layers of carbon-containing materials or amorphous carbon materials can be deposited on a substrate surface to function as adhesion enhancing layers or thermal stress relaxation layers to improve water performance of display devices, such as OLED devices, among others.

The invention further provides a single-layer or multilayer encapsulating film that can be used to prevent water and oxygen from diffusing onto a surface of substrate. The single-layer encapsulating film may be a silicon-containing inorganic barrier material, such as silicon nitride, silicon oxynitride, silicon oxide, silicon carbide, among others. The multilayer encapsulating film may include one or more barrier layers and one or more carbon-containing material layers. The one or more carbon-containing material layers are functioned to enhance adhesion and thermal stability of the encapsulating layer and/or the one or more barrier layers.

In one embodiment, the one or more carbon-containing material layers are deposited in between the one or more barrier layers. For example, alternating layers of at least one amorphous carbon layer and at least one barrier material layer are deposited on a surface of a substrate, such as a display device.

In another embodiment, a first barrier layer is deposited onto a surface of a substrate to provide good water-barrier performance before a first amorphous carbon layer. In still another embodiment, a multilayer encapsulating film is deposited on top of a substrate surface such that a final layer of a silicon-containing inorganic barrier material is deposited to provide good water-barrier performance of the multilayer encapsulating film.

Substrates of the invention can be circular or polygonal for semiconductor wafer manufacturing and flat panel display manufacturing. The surface area of a rectangular substrate for flat panel display is typically large, for example, a rectangle of about 500 mm$^2$ or larger, such as at least about 300 mm by about 400 mm, e.g., about 120,000 mm$^2$ or larger. In addition, the invention applies to any devices, such as OLED, FOLED, PLED, organic TFT, active matrix, passive matrix, top emission device, bottom emission device, solar cell, etc., and can be on any of the silicon wafers, glass substrates, metal substrates, plastic films (e.g., polyethylene terephthalate (PET), polyethylene naphthalate (PEN), etc.), plastic epoxy films, among others. Improved light transmittance and thus a transparent encapsulation/barrier film on top of a device are especially needed for top emission devices and active matrix devices.

Deposition of at Least One Carbon-Containing Material Layer

Aspects of the invention provide depositing a carbon-containing material layer with improved light transmittance at all wavelengths of a visible light spectrum, for example at wavelengths between 400 nm and 900 nm. The improvement is most dramatic at the wavelengths of between about 430 nm and about 570 nm. One exemplary carbon-containing material layer having a dielectric constant ($\kappa$) of less than about 4 is an amorphous carbon material. Other examples of carbon-containing materials include carbon-containing low-dielectric constant materials, silicon-doped carbon material, carbon-doped silicon material, diamond-like carbon material, among others.

Figure 3:
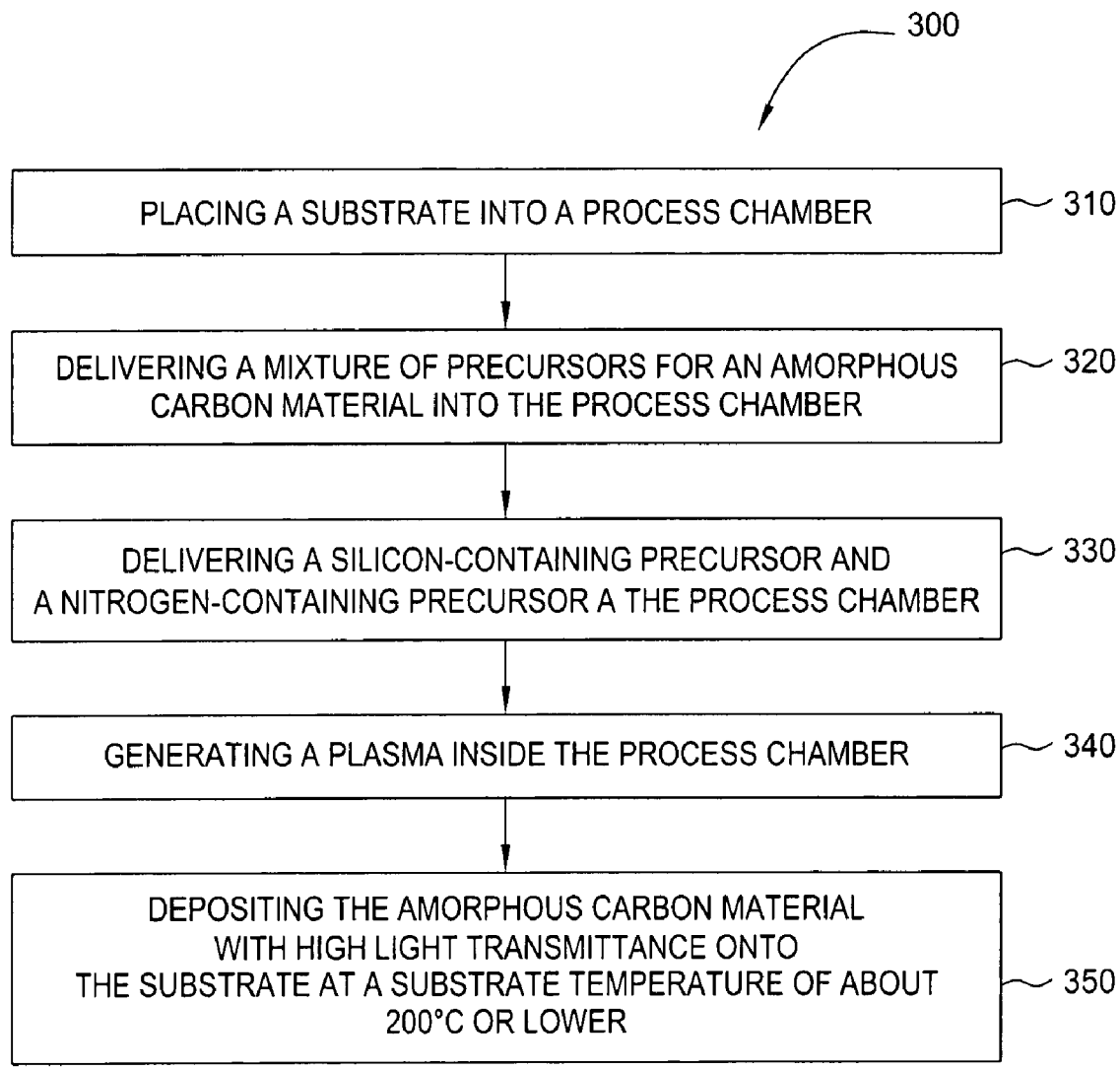
FIG. 3 is a flow chart of one exemplary method of forming a carbon-containing material layer with improved transmittance in a visible light spectrum on a substrate inside a substrate processing system in accordance with embodiments of the invention.

FIG. 3 illustrates a flow chart of a deposition method 300 in accordance with one embodiment of the invention. At step 310, a substrate is placed in a deposition process chamber for depositing a carbon-containing material, such as an amorphous carbon material layer on the substrate.

At step 320, a mixture of precursors for the amorphous carbon material is delivered into the process chamber. A wide variety of gas mixtures may be used to deposit the carbon-containing material, and non-limiting examples of such gas mixtures are provided below. Generally, the gas mixture may include one or more carbon-containing compounds and/or hydrocarbon compounds. Suitable organic carbon-containing compounds include aliphatic organic compounds, cyclic organic compounds, or combinations thereof. Aliphatic organic compounds have linear or branched structures comprising one or more carbon atoms.

Organic carbon-containing compounds contain carbon atoms in organic groups. Organic groups may include alkyl, alkenyl, alkynyl, cyclohexenyl, and aryl groups in addition to functional derivatives thereof. The carbon-containing precursor/compound can be delivered, for example, at a flow rate of about 10 standard cubic centimeters per minute (sccm) or larger, such as from about 100 sccm to about 500 sccm for a substrate size of about 400 mm×about 500 mm.

For example, the carbon-containing compound can have a formula $C_xH_y$, where x has a range of between 1 and 8 and y has a range of between 2 and 18, including, but not limited to, acetylene ($C_2H_2$), ethane ($C_2H_6$), ethene ($C_2H_4$), propylene ($C_3H_6$), propyne ($C_3H_4$), propane ($C_3H_8$), methane ($CH_4$), butane ($C_4H_{10}$), butylene ($C_4H_8$), butadiene ($C_4H_6$), benzene ($C_6H_6$), toluene ($C_7H_8$), and combinations thereof. Alternatively, partially or completely fluorinated derivatives of the carbon-containing compounds, for example, $C_3F_8$ or $C_4F_8$, may be used to deposit a fluorinated amorphous carbon layer, which may be described as an amorphous fluorocarbon layer. A combination of hydrocarbon compounds and fluorinated derivatives of hydrocarbon compounds may be used to deposit the amorphous carbon layer or amorphous fluorocarbon layer.

At step 330, a silicon-containing precursor and a nitrogen-containing precursor may be delivered in to the process chamber for depositing the amorphous carbon layer and improving the light transmittance of the amorphous carbon layer. Exemplary silicon-containing precursors for depositing the amorphous carbon layer may include silane ($SiH_4$), $SiF_4$, and $Si_2H_6$, among others. The silicon-containing precursor/compound can be delivered, for example, at a flow rate of about 10 sccm or larger, such as from about 20 sccm to about 80 sccm or at about 50 sccm.

In one embodiment, the flow rate of the carbon-containing compound is larger than the flow rate of the silicon-containing compound, preferable at a ratio of about 3:1 or larger, such as about 4:1 or larger, for depositing the carbon-containing material layer with mostly carbon content and smaller portion of silicon. In another embodiment, the silicon-containing precursor is used to dope the resulting carbon-containing material and improve the light transmittance of the carbon-containing material.

Exemplary nitrogen-containing precursors for depositing the amorphous carbon layer may include ammonium ($NH_3$), nitrogen gas ($N_2$), a combination of ammonium and nitrogen, nitrous oxide ($N_2O$), nitric oxide (NO), and combinations thereof, among others. For example, the nitrogen-containing precursor for depositing the amorphous carbon layer and improving the light transmittance of the amorphous carbon layer can be ammonium ($NH_3$) or nitrogen gas ($N_2$), or alternatively a mixture of ammonium ($NH_3$) and nitrogen gas ($N_2$), as delivered form various gas sources connected to the process chamber. The nitrogen-containing precursor/compound can be delivered, for example, at a flow rate of 100 sccm or larger, such as from about 200 sccm to about 5000 sccm, preferably from about 500 sccm to about 1500 sccm. In one embodiment, the nitrogen-containing precursor is used to improve the light transmittance of the carbon-containing material.

When the silicon-containing precursor and the nitrogen-containing precursor are added as a source gas, a more transparent amorphous carbon film is obtained. The light transmittance is thus improved to about 80% or higher, such as about 90% or higher, about 95% or higher, or about 97% or higher, at all wavelengths of the visible light, e.g., at wavelengths between 400 nm and 900 nm. In contrast, without adding the silicon-containing precursor and the nitrogen-containing precursor, the deposited low-dielectric constant amorphous carbon material is not very transparent, showing low light transmittance in a visible light spectrum, especially at lower wavelengths.

In addition, a variety of gases may be added to the gas mixture to modify properties of the amorphous carbon layer. An inert gas (e.g., helium, argon, neon, xenon, krypton, etc.), among others, delivered at a flow rate of about 5 sccm or larger, such as between about 100 sccm to about 6000 sccm, are used to control the density and deposition rate of the amorphous carbon layer. Further, the addition of $H_2$ and/or $NH_3$ can be used to control the hydrogen ratio of the amorphous carbon layer to control the properties of the amorphous carbon layer, such as reflectivity. For example, a hydrogen gas may be delivered into the process chamber to enhance film uniformity (decrease in % uniformity measurement and decrease in surface roughness). When the hydrogen gas is added as a source gas, a film uniformity of about +/−10% or lower, such as about +/−5% or lower or about +/−3% or lower, is obtained. In contrast, without adding the hydrogen gas, the deposited amorphous carbon material is very rough and non-uniform with a film uniformity measurement of between about +/−15% to about +/−35%. Without the hydrogen gas to improve film uniformity, there is a much more drastic impact on step coverage when multiple layers are deposited. An amorphous carbon material layer with enhanced film uniformity (a smooth and uniform film surface) significantly improves step coverage to about 80% or higher, or even about 95% or higher, and also adheres well in between silicon-containing inorganic barrier layers in a multilayer film stack.

At step 340, an electric field is applied and a plasma is generated inside the process chamber. The electric field can be generated by applying a power source, such as radio-frequency power, microwave frequency power, to the process chamber. The power source can be coupled to the process chamber inductively or capacitively. Power from a single 13.56 MHz RF power source may be supplied to the process chamber to form the plasma at a power density between about 0.14 watts/cm$^2$ and about 8.6 Watts/cm$^2$, or a power level between about 100 watts and about 6000 watts. A power density between about 0.25 watts/cm$^2$ and about 0.6 watts/cm$^2$ is preferably supplied to the process chamber to generate the plasma. The RF power may be provided at a frequency between about 0.01 MHz and 300 MHz. The RF power may be provided continuously or in short duration cycles. RF power is coupled to the process chamber to increase dissociation of the compounds. The compounds may also be dissociated in a microwave chamber prior to entering the deposition chamber. However, it should be noted that the respective parameters may be modified to perform the plasma processes in various chambers and for different substrate sizes.

The carbon-containing compound, the silicon-containing precursor, the nitrogen-containing precursor, and/or the hydrogen gas are introduced to the process chamber from different supply sources through a gas distribution system and into the process chamber. The gas distribution system is generally spaced between about 180 mils and about 2000 mils, such as about 900 mils, from the substrate on which the amorphous carbon layer is being deposited upon. In addition, the pressure of the process chamber is maintained at about 100 milliTorr to about 20 Torr, such as at about 1.5 Torr.

At step 350, the amorphous carbon material with high light transmittance is deposited onto the substrate at a substrate temperature of about 200° C. or lower, such as a substrate temperature maintained at between about −20° C. and about 100° C., and preferably maintained at a temperature between about 20° C. and about 80° C. A preferred amorphous carbon layer is deposited, in one embodiment, by supplying acetylene to a plasma process chamber at a flow rate between about 100 sccm and about 5,000 sccm, such as about 200 sccm. Silane is also supplied at a flow rate between about 10 sccm, and about 200 sccm, such as about 50 sccm. Ammonium and/or nitrogen gases are added at a flow rate between about 300 sccm, and about 2,000 sccm, such as about 1,000 sccm. A hydrogen gas is also added to the process chamber at a flow rate between about 100 sccm and about 2,500 sccm, such as between about 200 sccm and about 600 sccm.

The above mentioned steps are repeated until a desired thickness of the carbon-containing material is obtained. The above process parameters provide a typical deposition rate for the amorphous carbon layer in the range of about 500 Å/min or more, such as between about 1,000 Å/min to about 2,000 Å/min, and can be implemented on a chemical vapor deposition chamber in a conventional parallel-plate radio-frequency (RF) plasma enhanced chemical vapor deposition (PECVD) system, available from Applied Materials, Inc., Santa Clara, Calif. The amorphous carbon deposition parameters provided herein are illustrative and should not be construed as limiting the scope of the invention.

The deposited amorphous carbon material includes carbon and hydrogen atoms, which may be an adjustable carbon:hydrogen ratio that ranges from about 10% hydrogen to about 60% hydrogen. Controlling the hydrogen ratio of the amorphous carbon layer is desirable for tuning its respective optical properties, etch selectivity, and chemical mechanical polishing resistance properties. Specifically, as the hydrogen content decreases, the optical properties of the as-deposited layer, for example, the index of refraction (n) and the absorption coefficient (k), increase. Similarly, as the hydrogen content decreases, the etch resistance of the amorphous carbon layer increases.

In addition, flow rate ratio of the hydrocarbon-containing precursor and the silicon-containing precursor for depositing the amorphous carbon material can be adjusted, for example, to a ratio of 4:1 or larger, such that the carbon content is larger than the silicon content in the deposited amorphous carbon material. Further, experimental results demonstrate that deposition of the amorphous carbon material in the presence of the silicon-containing precursor and the nitrogen-containing precursor results in not only the improved light transmittance of the final film but also lead to reduced C—H bonds and increased N—H bonds and Si—C bonds in the final amorphous carbon film. Thus, it is desirable to control the compositions of covalent bonding as well as the ratio between different types of atoms during the deposition of the amorphous carbon material by adding the silicon-containing precursor, the nitrogen-containing precursor, and/or the hydrogen gas in addition to a carbon-containing gas mixture and adjusting their flow rates in order to improve light transmittance of the amorphous carbon material.

It is understood that embodiments of the invention include scaling up or scaling down any of the process parameter/variables as described herein according to substrate sizes, chamber conditions, etc., among others. It is also noted that embodiments of the invention do not require the steps to be performed in the order as described herein. For example, a hydrogen gas can be delivered into the process chamber before a mixture of the precursors is delivered into the chamber, and in some cases, steps 320 and 330 can be performed at the same time.

Deposition of an Encapsulating Film

Figure 4:
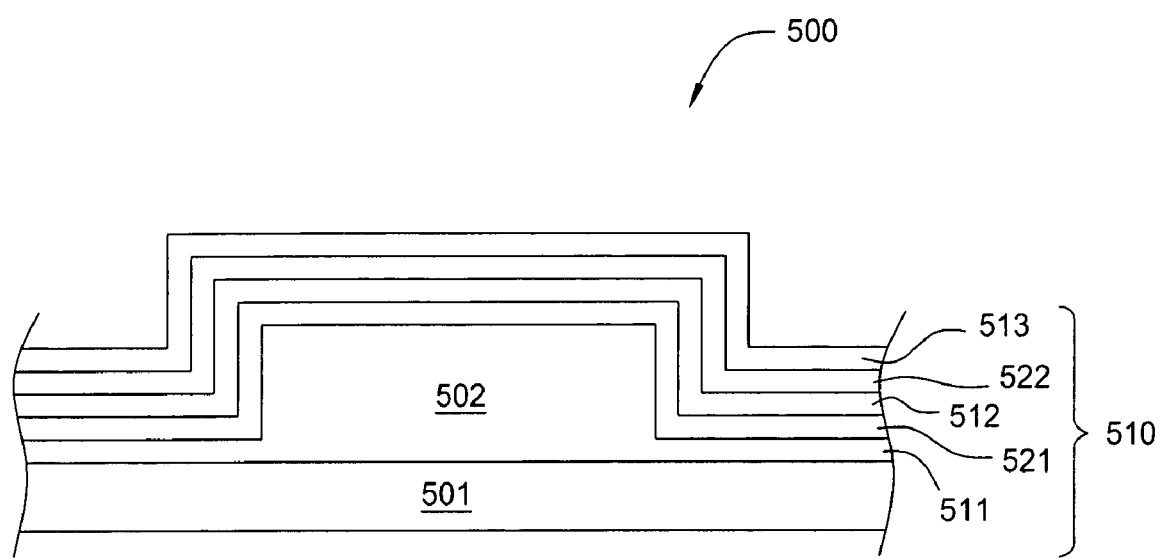
FIG. 4 depicts a cross-sectional schematic view of one embodiment of a multilayer encapsulating film having one or more carbon-containing material layers with improved transmittance in accordance with one method of the invention.

Aspects of the invention provide alternatively depositing a carbon-containing material layer and a silicon-containing inorganic barrier layer. FIG. 4 shows an exemplary display device 500 fabricated using methods of the invention to include a multilayer encapsulating film having one or more carbon-containing material layers with improved transmittance according to embodiments of the invention. The display device 500 may include a substrate 501 and a device 502. A encapsulating film 510 which may include multiple material layers and a thickness of about 1,000 Å or larger is then deposited using methods of the invention to prevent water/moisture and air to penetrate into the substrate 501 and the device 502 and also provide high light transmittance for emitting light from the device 502 when a voltage is applied.

The device 502 may include a transparent anode layer, which could be made of glass or plastic, such as polyethyleneterephthalate (PET) or polyethyleneterephthalate (PEN). An example of the transparent anode layer is an indium-tin-oxide (ITO) with the thickness in the range of about 200 Å to about 2000 Å. In addition, multiple layers of organic or polymer materials can be deposited and patterned in the device 502. For example, a hole-transport layer at a thickness of about 200 Å to about 1000 Å, such as those of diamine, such as a naphthyl-substituted benzidine (NPB) derivative, or N, N'-diphenyl-N, N'-bis(3-methylphenyl)-(1, 1'-biphenyl)-4,4'-diamine (TPD), can be included in the device 502.

An emissive layer can be deposited in the device 502. Materials for the emissive layer typically belong to a class of fluorescent metal chelated complexes. An example is 8-hydroxyquinoline aluminum ($Alq_3$). The thickness of the emissive layer is typically in the range of about 200 Å to about 1500 Å. After the emissive layer is deposited, these organic layers are patterned. OLED displays are typically deposited on a pre-patterned surface of the substrate by ink-jet printing or evaporation method. A cathode layer, which can be a metal, a mixture of metals or an alloy of metals, is also required to be deposited and patterned in the device 502. An example of the cathode material is an alloy of magnesium (Mg), silver (Ag) and aluminum (Al) in the thickness range of about 1000 Å to about 3000 Å.

The device 502 may be any types of display devices which need to be encapsulated. For example, the device 502 can be OLED, FOLED, PLED, organic TFT, solar cell, top emissive device, bottom emissive device, active matrix devices, passive matrix devices, among others. The encapsulating film 510 is deposited on top of the substrate surface after construction of the device 502, such as an OLED display device, is complete. Exemplary materials of the encapsulating film 510 of the invention include a thin layer of inorganic nitride film, inorganic oxide film, and polymer-type organic film deposited in the thickness range of about 500 Å to about 500,000 Å, such as between about 2,000 Å to about 50,000 Å. For example, silicon nitride (SiN), silicon oxynitride (SiON), silicon oxide (SiO), and silicon carbide (SiC), among others, can be used as the encapsulating material.

According to embodiments of the invention, the encapsulating film 510 deposited over the device 502 on the surface of the substrate 501 includes one or more layers of barrier/encapsulating materials, such as inorganic nitride, inorganic oxide film and polymer-type organic material, etc., and one or more additional material layers, such as various carbon-containing materials and polymer-type organic materials, and low-dielectric constant materials, e.g., amorphous carbon, diamond-like-carbon, silicon-doped carbon material, carbon-doped silicon containing material, etc., in the encapsulating layer to enhance adhesion and soften the encapsulating layer.

In one embodiment, a multilayer encapsulating film having at least one barrier layer and at least one amorphous carbon material layer with improved light transmittance deposited using methods of the invention is provided by adding a silicon-containing precursor and a nitrogen-containing precursor during the deposition of the at least one amorphous carbon material layer. In another embodiment, a multilayer encapsulating film having at least one barrier layer and at least one amorphous carbon material layer is deposited on top of the device 502 to prevent water and other gases or liquids from diffusing into the device 502 and short-circuit the device 502 without the multilayer encapsulating film being cracked or fallen off the surface of the device 502 due to poor adhesion and thermal instability. As shown in FIG. 4, the encapsulating film 510 includes alternating layers of one or more barrier layers 511, 512, 513, etc., and one or more carbon-containing material layers 521, 522, etc.

In one aspect, the invention provides the one or more carbon-containing material layers 521, 522, such as multiple layers of amorphous carbon materials, deposited in between the one or more barrier layers 511, 512, 513. In another aspect, the final layer of the multilayer encapsulating film deposited on top of a substrate surface is a barrier layer, such as the barrier layer 513. The final layer includes a barrier material, such as silicon nitride, silicon oxynitride, silicon oxide, and silicon carbide, among others, deposited using method of the invention to serve as a good water and oxygen barrier for the final surface of the exemplary display device 500.

The first layer on top of the device 502 can be a carbon-containing material layer or a barrier layer. In a preferred embodiment, the invention provides a first layer deposited on top of the device 502 being a barrier layer to enhance water-barrier performance for the exemplary display device 500. For example, a first barrier layer, such as the barrier layer 511, can be deposited before an adhesion enhancing layer and/or a carbon-containing material layer, such as the carbon-containing material layer 521. Accordingly, the carbon-containing material layers are deposited on top of the barrier layers to promote adhesion between adjacent barrier layers such that the multilayer encapsulating film can be deposited into sufficient thickness, such as about 8,000 Å or larger.

Figure 5:
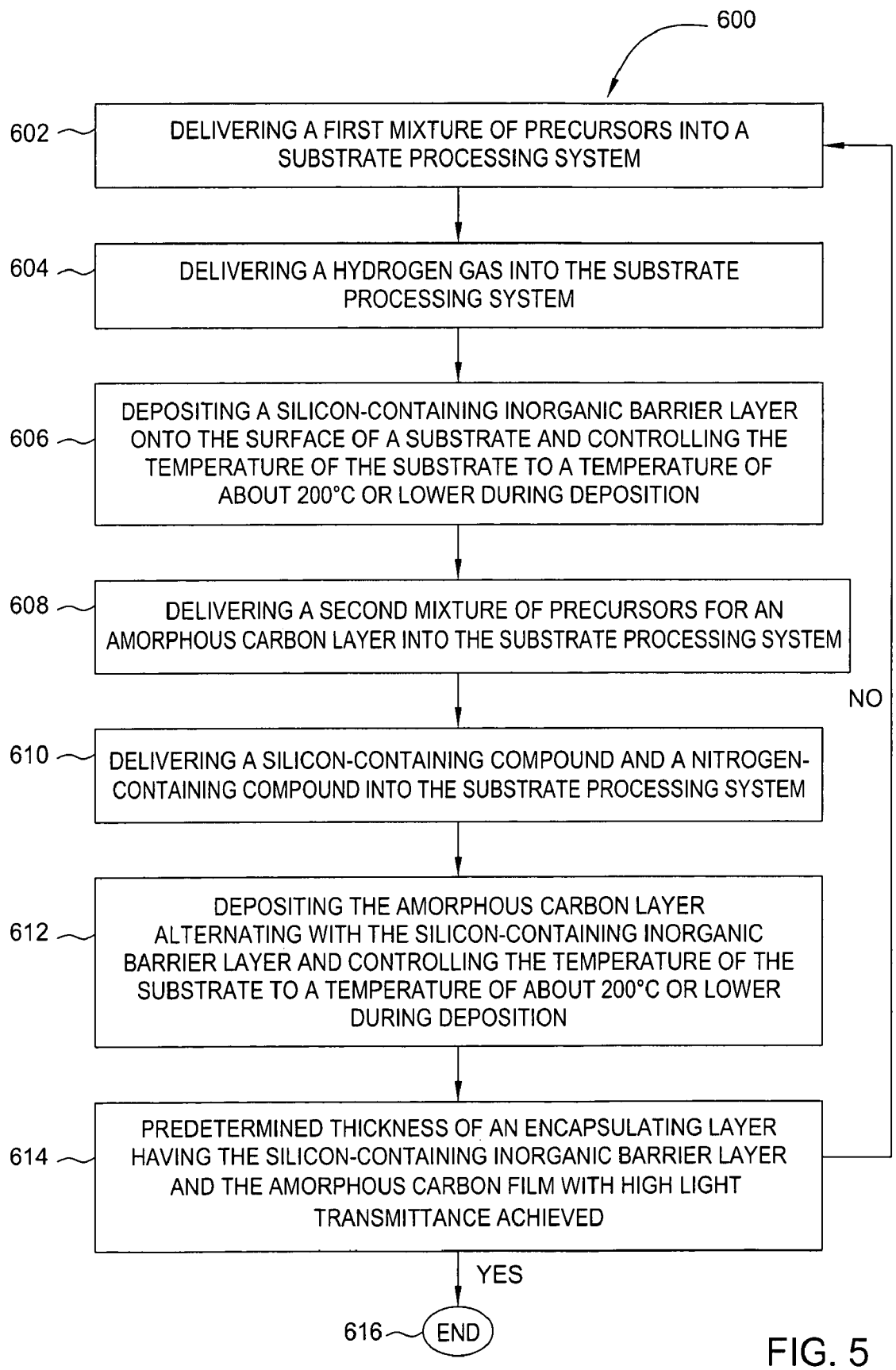
FIG. 5 is a flowchart of one method of forming a multilayer encapsulating film on a substrate inside a substrate processing system in accordance with embodiments of the invention.

FIG. 5 illustrates a flow chart of a deposition method 600 in accordance with one embodiment of the invention. First of all, a substrate is placed in a process chamber of a substrate processing system for depositing a material layer, such as the encapsulating film 510, on the substrate. The method 600 optionally includes a step of forming a device on the substrate. Exemplary devices include, but is not limited to, OLED, PLED, and FOLED, among others.

At step 602, a first mixture of precursors for a barrier layer, such as a silicon-containing barrier layer, is delivered into the substrate processing system. The first mixture of precursors may include one or more silicon-containing gases, such as silane ($SiH_4$), $SiF_4$, and $Si_2H_6$, among others. The first mixture of precursors may further include one or more nitrogen-containing gases, such as ammonia ($NH_3$), nitrous oxide ($N_2O$), nitric oxide (NO), and nitrogen gas ($N_2$), among others. The first mixture of precursors may also include a carbon-containing gas and/or an oxygen-containing gas.

For example, a silicon nitride barrier layer can be deposited from a mixture of a silicon-containing gas and a nitrogen-containing gas, such as a mixture of silane, ammonia, and/or nitrogen gas. As another example, a silicon oxynitride barrier layer can be deposited from a mixture of a silicon-containing gas, an oxygen-containing gas, and a nitrogen-containing gas, such as a mixture of silane, nitrous oxide, and/or nitrogen gas.

At step 604, a hydrogen gas is delivered into the substrate processing system and a silicon-containing inorganic barrier layer is deposited onto the surface of a substrate at a substrate temperature of about 200° C. or lower at step 606. The substrate temperature during substrate processing for a display device, such as an OLED device, needs to be kept at low temperature due to thermal instability of multiple layers of organic materials in an OLED device. In generally, a temperature of about 150° C. or lower is desired, such as about 100° C. or lower, about 80° C. or lower, or between about 20° C. and about 80° C.

It is found that the presence of a hydrogen gas reduces the surface roughness of the deposited silicon-containing inorganic barrier layer, resulting in a surface roughness measurement (RMS) of from about 40 Å to about 70 Å being reduced to about 40 Å or lower, such as about 15 Å or lower, preferably about 10 Å or lower. We have also found that a barrier layer with reduced surface roughness (a smooth surface) significantly prevents water penetration into the barrier layer, making it a good encapsulating layer for any materials underneath (e.g., organic and/or polymer materials used for display devices). The introduction of hydrogen gas prevents water penetration with a water vapor transmission rate of less than about $1 \times 10^{-2}$ grams per square meter per day, such as between about $1 \times 10^{-3}$ grams per square meter per day to about $1 \times 10^{-4}$ grams per square meter per day as measured at about 38° C. with 90% relative humidity.

At step 608, a second mixture of precursors for a carbon-containing material layer is delivered into the same or a different substrate processing system. Preferably, the carbon-containing material layer is processed in the same substrate processing system as the barrier layer deposition system for increasing the throughput of substrate processing. In addition, the substrate can be placed in the same or different process chamber of a substrate processing system for depositing the barrier layer and/or the carbon-containing material for ease of operation and reducing the chance of air and moisture exposure when taking the substrate in and out of a substrate processing system.

The second mixture of precursors may include one or more carbon-containing compounds, such as acetylene ($C_2H_2$), ethane ($C_2H_6$), ethene ($C_2H_4$), methane ($CH_4$), propylene ($C_3H_6$), propyne ($C_3H_4$), propane ($C_3H_8$), butane ($C_4H_{10}$), butylene ($C_4H_8$), butadiene ($C_4H_6$), benzene ($C_6H_6$), and toluene ($C_7H_8$), among others.

The carbon-containing material layer may be an amorphous carbon material, a diamond-like-carbon material, silicon-doped carbon material, and carbon-doped silicon containing material, among others. For example, an amorphous carbon layer can be deposited from a mixture of a carbon-containing compound, such as acetylene ($C_2H_2$).

At step 610, a silicon-containing compound and a nitrogen-containing compound are delivered into the substrate processing system and a carbon-containing material layer, such as an amorphous carbon layer, is deposited onto the surface of a substrate at a substrate temperature of about 200° C. or lower at step 612. Additionally, a hydrogen gas and a combination of different nitrogen-containing gases may also be delivered into the substrate processing system for depositing the amorphous carbon layer. Preferably, a substrate temperature of about 150° C. or lower, such as about 100° C. or lower, about 80° C. or lower, or between about 20° C. and about 80° C., is used.

It is also found that the presence of a silicon-containing compound and a nitrogen-containing compound improves light transmittance of the deposited amorphous carbon layer, resulting in about 80% or higher light transmittance, such as about 90% or higher transmittance, at all wavelengths of the visible light. Thus, the deposited amorphous carbon layer was made much more transparent than prior art films, suitable for applications where a transparent film is needed for emitting light.

It is also found that the presence of a hydrogen gas improves film uniformity of the deposited carbon-containing material layer, resulting in a film uniformity measurement of from between about +/−15% to about +/−35% being improved to about +/−10% or lower, such as about +/−5% or lower or about +/−3% or lower. We have also found that a carbon-containing material layer with improved film uniformity significantly improves the step coverage of the deposited carbon-containing material layer, such that additional multilayer can be deposited with good step coverage. For example, a step coverage of about 80% or higher, e.g., about 95% or higher, for layers of the encapsulating film is observed.

At step 614, if a predetermined thickness of an encapsulating film having the silicon-containing inorganic barrier layer and the amorphous carbon material layer is obtained, the deposition process can be ended at step 616. However, if a predetermined thickness of the encapsulating layer is not obtained, then any of the combinations of steps 602, 604, 606, 608, 610, 612 can be repeated. For example, once a desired thickness is obtained after one or more silicon-containing inorganic barrier layer and one or more carbon-containing material layers are deposited, the method 600 may end where a silicon-containing inorganic barrier layer or a carbon-containing material layers is last deposited.

The thickness of the encapsulating layer can vary. For example, a thickness of about 1,000 Å or larger, e.g., about 10,000 Å or larger, such as between about 20,000 Å to about 60,000 Å, may be desired. We have found out that the thickness of an encapsulating film for the device 502 is correlated to its air and moisture barrier performance, thus lengthening the lifetime of the device 502. Using methods of the invention, a lifetime of about 40 days or longer for the device 502, such as about 45 days or longer, or about 60 days or longer can be obtained.

Further, since the transmittance of the amorphous carbon material layer is improved and the silicon-containing inorganic barrier layer is generally of high light transmittance, the overall light transmittance of the encapsulating film having the silicon-containing inorganic barrier layer and the amorphous carbon material layer is greatly improved. As a result, the encapsulating film having the can be made pretty thick for lengthening the lifetime of the device 502 and yet still very transparent, allowing visible light to transmit through.

In one aspect, a single barrier layer deposited using methods of the invention can be used as an encapsulating film for a display device of the invention. For example, a single silicon nitride barrier layer having a thickness of about 10,000 Å can be used as an encapsulating film. In another aspect, the invention provides a multilayer encapsulating film having at least one silicon-containing inorganic barrier layer and at least one carbon-containing material layer. The silicon-containing inorganic barrier layer may have a thickness of between about 1,000 Å to about 10,000 Å, such as between about 2,000 Å to about 8,000 Å. The carbon-containing material layer may have a thickness of between about 1,000 Å to about 10,000 Å. It is found that the presence of a carbon-containing material increase adhesion between adjacent barrier layers with improved thermal stability, making multilayer of silicon-containing inorganic barrier layer at a sufficient thickness possible.

One exemplary encapsulating film of the invention may include two silicon nitride layers and an amorphous carbon material layer in between the silicon nitride layer for a total thickness of about between about 3,000 Å to about 30,000 Å. Another exemplary encapsulating film of the invention may include five silicon nitride layers and four amorphous carbon material layers in between the five silicon nitride layers for a total thickness from about 9,000 Å to about 90,000 Å.

The surface of the substrate may be cleaned with a plasma before or after each layer is deposited. For example, one or more cleaning gases can be supplied to the process chamber and an electric field from an RF power source or microwave power source can be applied to generate a cleaning plasma. The cleaning gases may include, but are not limited to, oxygen-containing gas (e.g., oxygen, carbon dioxide), hydrogen-containing gas (e.g., hydrogen gas), nitrogen-containing gas (e.g., ammonia, nitrous oxide), inert gas (e.g., helium, argon), among others. Examples of hydrogen-containing gas include, but are not limited to, hydrogen gas ($H_2$) and ammonia ($NH_3$), among others. In addition, when the chamber is cleaned by a plasma generated from a cleaning gas, the cleaning gas may optionally be delivered with a carrier gas and supplied into the chamber. Exemplary carrier gas includes inert gases, such as helium and argon, among others. For example, an in-situ oxygen plasma may be generated to clean away any material inside the process chamber, such as materials on the chamber walls, gas distribution plate, everywhere, after previous substrate processing and substrate removal.

It is noted that embodiments of the invention do not require the steps to be performed in the order as described herein. For example, a hydrogen gas can be delivered into the process chamber before a mixture of the precursors is delivered into the chamber, and in some cases, steps 602 and 604 can be performed at the same time. Similarly, steps 608 and 610 can be performed at the same time.

Deposition of at Least One Silicon-Containing Barrier Layer

One or more silicon-containing inorganic barrier layers are deposited from a mixture of precursors delivered into the process chamber. The precursors may include a silicon-containing precursor, such as silane ($SiH_4$), $Si_2H_6$, $SiF_4$, among others, for depositing a layer of silicon nitride (SiN), silicon oxynitride (SiON) or silicon oxide (SiO), silicon carbide (SiC), among others, as an encapsulating layer onto the substrate. The silicon-containing precursor can be delivered, for example, at a flow rate of 10 sccm or larger, such as from about 100 sccm to about 500 sccm for a substrate size of about 400 mm×about 500 mm. A nitrogen-containing precursor can be delivered at a flow rate of about 5 sccm or larger, such as from about 100 sccm to about 6000 sccm for various nitrogen-containing precursors.

For example, a mixture of the precursors may include silane, nitrous oxide, and nitrogen, among others, for depositing a silicon oxynitride film. Alternatively, silane, ammonia, and nitrogen, among others are used for depositing a silicon nitride film. Also, the precursors may include silane, and nitrous oxide for depositing a silicon oxide film. In addition, each precursor can be delivered at different or the same flow rate, depending on various deposition parameters required. It is understood that embodiments of the invention include scaling up or scaling down any of the process parameter/variables as described herein according to substrate sizes, chamber conditions, etc., among others.

During deposition of the one or more silicon-containing inorganic barrier layers, a hydrogen gas is delivered into the process chamber to improve water-barrier performance of the encapsulating layer of the invention. In addition, the introduction of the hydrogen gas is found to reduce surface roughness of the one or more silicon-containing inorganic barrier layers, making it a good encapsulating layer.

The one or more silicon-containing inorganic barrier layers are deposited onto the substrate by applying an electric field and generating a plasma inside the process chamber. The electric field can be generated by applying a power source, such as radio-frequency power, microwave frequency power, to the process chamber. The power source can be coupled to the process chamber inductively or capacitively. In addition, the pressure of the process chamber is maintained at about 0.5 Torr to about 10 Torr.

As a result, the one or more silicon-containing inorganic barrier layers are deposited at a deposition rate of about 500 Å/min or larger, such as between about 1000 Å/min to about 3000 Å/min. The thickness of the one or more silicon-containing inorganic barrier layers may be varied to a range of from about 1,000 Å to about 30,000 Å. Usually a thicker barrier layer is better than a thinner barrier layer for preventing water penetration.

Conventional low temperature inorganic film deposition processes have produced undesired properties in an encapsulating layer. For example, the film is less dense and the surface of the film is rough with defect structure and poor film property, such as high refractive index change after water test, high transmission fourier transform infrared spectra (FTIR) change, high water vapor transmission rate (WVTR) after water test. As an example, deposition of a silicon nitride thin film with good water-barrier performance to be used as a good moisture barrier/film will be further illustrated herein below, but the invention is not meant to be limited to the details described herein.

Substrates (400 mm×500 mm in size) were brought under vacuum inside a chamber of a conventional parallel-plate radio-frequency (RF) plasma enhanced chemical vapor deposition (PECVD) system, AKT 1600 PECVD, available from Applied Materials, Inc., Santa Clara, Calif. with a spacing of about 900 mils. The temperature of the substrate support (susceptor) was set at about 60° C. for a low temperature deposition process. Mixtures of silane ($SiH_4$), ammonia ($NH_3$), nitrogen ($N_2$) in the presence of hydrogen gas ($H_2$) were delivered into the chamber as the source precursor gases for depositing a silicon nitride film as moisture and oxygen barrier. As a comparison, prior art methods of using silane ($SiH_4$), ammonia ($NH_3$), and a nitrogen ($N_2$) for depositing silicon nitride was prepared in parallel under the same process conditions. The pressure inside the chamber is about 2.1 Torr. A plasma was sustained with RF power generator set at about 13.56 MHz and about 900 W.

Basic film properties were compared for films prepared from both process conditions. The results showed that silicon nitride films deposited in the presence and absence of hydrogen source gas exhibit similar basic film properties initially with refractive index (RI) of about 1.7 to about 1.9 and film stress of zero to about $2×10^9$ dynes/$cm^2$. The deposition rate is comparable for both films at about 1000 Å/min to about 1500 Å/min. Thus, the presence of hydrogen gas does not affect basic film properties or the deposition rate.

However, surface roughness after deposition (in the unit of root mean square, RMS) for both films varied dramatically. Both films were compared under microscope, and 3-dimensional surface roughness images were compared and surface roughness was measured. The average surface roughness for SiN film deposited without hydrogen source gas was about 40 Å to about 70 Å, indicating a rough surface. The average surface roughness for SiN film deposited in the presence of hydrogen source gas was about 9 Å to about 12 Å, indicating a smooth surface.

The comparison was more significant when both films were compared after water test to measure the effect of water/moisture on film property. According to Table 1 for a comparison of key water-barrier performance, it is found that $H_2$ source gas plays an important role to reduce film surface roughness into a smooth surface, and a smooth surface prevents water/oxygen penetration from atmosphere into the film inside, resulting in much lower WVTR (Water Vapor Transmission Rate) value, a key parameter in the flat panel display industry to indicate resistance to moisture/water. Water test to measure WVTR is a high-humidity test usually carried out by placing a test structure in a humidity chamber operating at a temperature range of about 25° C. to about 100° C. and about 40% to about 100% relative humidity (RH) for a specified amount of time (in hours or days, etc.). The amount of water retained on the specific size of the tested structure per test time was calculated to give a Water Vapor Transmission Rate (WVTR) at the tested temperature and tested relative humidity.

TABLE 1

Comparison of key water-barrier performance

|  | SiN film without H2 | SiN film with H2 |
|---|---|---|
| Surface roughness after deposition (RMS) | about 40 Å to about 70 Å | about 9 Å to about 12 Å |
| Refractive Index (RI) change after water treatment (100° C./ 100 hours) | 15% | 0% |
| FTIR change after water treatment (100° C./ 100 hours) | O—H bond increased, Si—H bond reduced, N—H bond reduced | No change |
| Water Vapor Transmission Rate (WVTR) at 38° C./ 90% relative humidity | More than about $1.0 × 10^{-2}$ g/$m^2$ day | About $1.0 × 10^{-4}$ g/$m^2$ day to about $1.0 × 10^{-3}$ g/$m^2$ day |

The transmission fourier transform infrared spectra (FTIR) before and after water treatment for the SiN film deposited with hydrogen source gas were also performed and compared. Water treatment for comparison of change in FTIR and refractive index (RI) were also performed by soaking different deposited films in hot water, such as about 100° C., for a specified amount of time, e.g., about 100 hours. The FTIR spectra were recorded in the range of 1500 $cm^{-1}$ to 4000 $cm^{-1}$. The Si—H, N—H, and O—H bonds were indicated in the spectra. There is not much difference before and after water treatment, indicating no change of any bonds after water treatment from the SiN film deposited with a hydrogen source gas. The results, as shown in Table 1, also indicated that, after treatment of the SiN film in water at about 100° C. for about 100 hours (hot and humid), there is no change of refractive index for the SiN film deposited under the deposition conditions in the presence of hydrogen gas as one of the precursor source gases. Together with the results of low water vapor transmission rate (WVTR) measured after water test, all of which are indicative that a high quality silicon nitride was deposited with good water-barrier performance using a hydrogen gas as part of source gas mixtures.

As a comparison, the transmission fourier transform infrared spectra (FTIR) change before and after water treatment for the SiN films deposited using prior art method without hydrogen source gas were also performed and compared. The results demonstrated a big decrease in Si—H bond, a small decrease in N—H bond, and a small peak increase in O—H bond. The results, also shown in Table 1, indicated that, there is about 15% change of refractive index for the SiN film deposited without a hydrogen source gas. In addition, higher water vapor transmission rate (WVTR) was measured after water test. All of which are indicative that the silicon nitride film deposited in the absence of hydrogen source gas exhibits poor water-barrier performance.

Substrate Processing System

The invention is illustratively described below in reference to a plasma enhanced chemical vapor deposition system configured to process large area substrates, such as various parallel-plate radio-frequency (RF) plasma enhanced chemical vapor deposition (PECVD) systems including AKT 1600, AKT 3500, AKT 4300, AKT 5500, AKT 10K, AKT 15K, and AKT 25K for various substrate sizes, available from AKT, a division of Applied Materials, Inc., Santa Clara, Calif. However, it should be understood that the invention has utility in other system configurations, such as other chemical vapor deposition systems and any other film deposition systems, including those systems configured to process round substrates.

The invention provides a substrate processing system having one or more process chambers in order to deposit a single-layer or multilayer encapsulating film with improved light transmittance on a substrate surface. The multilayer encapsulating film of the invention can be deposited in the same or different substrate processing system, in the same or different process chambers of a substrate processing system. In one embodiment, the multilayer encapsulating film is deposited is deposited in the same vacuum substrate processing system to save time and improve processing throughput. In another embodiment, the multilayer encapsulating film of the invention can be deposited on a substrate surface in the same or different process chambers inside a multi-chambered substrate processing system. For example, the multilayer encapsulating film having one or more silicon-containing inorganic barrier layers and one or more carbon-containing material layers can be efficiently deposited in a chemical vapor deposition (CVD) system without taking the substrate out of the CVD system and decrease the possibility of water and oxygen to diffuse onto the substrate surface.

Figure 6:
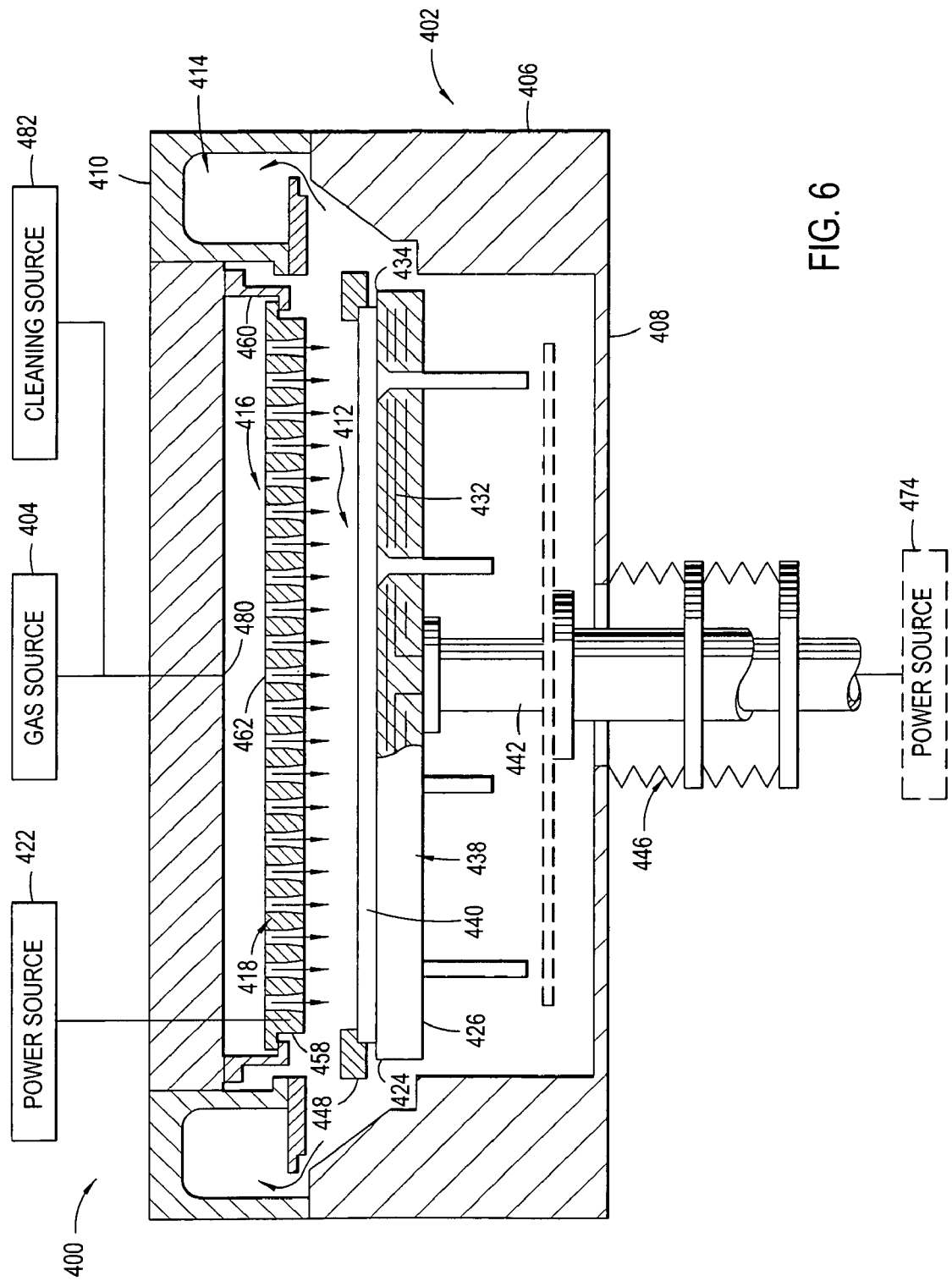
FIG. 6 is a schematic cross-sectional view of one embodiment of a process chamber in accordance with the invention.

FIG. 6 is a schematic cross-sectional view of one embodiment of a substrate processing system 400 having one or more plasma enhanced chemical vapor deposition chambers, available from AKT, a division of Applied Materials, Inc., Santa Clara, Calif. The substrate processing system 400 generally includes one or more processing chambers 402, substrate input/output chambers, a main transfer robot for transferring substrate among the substrate input/output chambers and the processing chambers 402, and a mainframe controller for automatic substrate processing control.

The processing chamber 402 is usually coupled to one or more gas sources 404 for delivery one or more source compounds and/or precursors. The one or more gas sources 404 may include a silicon-containing compound supply source, a hydrogen gas supply source, a carbon-containing compound supply source, a nitrogen-containing compound supply source, among others. The processing chamber 402 has walls 406 and a bottom 408 that partially define a process volume 412. The process volume 412 is typically accessed through a port and a valve (not shown) to facilitate movement of a substrate 440, such as a large area glass substrate, into and out of the processing chamber 402. The walls 406 support a lid assembly 410 that contains a pumping plenum 414 that couples the process volume 412 to an exhaust port (that includes various pumping components, not shown) for exhausting any gases and process by-products out of the processing chamber 402.

A temperature controlled substrate support assembly 438 is centrally disposed within the processing chamber 402. The substrate support assembly 438 supports the substrate 440 during processing. The substrate support assembly 438 comprises an aluminum body 424 that encapsulates at least one embedded heater 432. The heater 432, such as a resistive element, disposed in the substrate support assembly 438, is coupled to an optional power source 474 and controllably heats the support assembly 438 and the substrate 440 positioned thereon to a predetermined temperature.

In one embodiment, the temperature of the heater 432 can be set at about 200° C. or lower, such as 150° C. or lower, or between about 20° C. to about 100° C., depending on the deposition/processing parameters for a material layer being deposited. For example, the heater can be set at between about 60° C. to about 80° C., such as at about 70° C., for a low temperature deposition process.

In another embodiment, a port having hot water flowing therein is disposed in the substrate support assembly 438 to maintain the substrate 440 at a uniform temperature of 200° C. or lower, such as between about 20° C. to about 100° C. Alternatively, the heater 432 can be turned off with only hot water flowing inside the substrate support assembly 438 to control the temperature of the substrate during deposition, resulting in a substrate temperature of about 100° C. or lower for a low temperature deposition process.

The support assembly 438 generally is grounded such that RF power supplied by a power source 422 to a gas distribution plate assembly 418 positioned between the lid assembly 410 and substrate support assembly 438 (or other electrode positioned within or near the lid assembly of the chamber) may excite gases present in the process volume 412 between the support assembly 438 and the gas distribution plate assembly 418. The RF power from the power source 422 is generally selected commensurate with the size of the substrate to drive the chemical vapor deposition process.

In one embodiment, a RF power of about 10 W or larger, such as between about 400 W to about 5000 W, is applied to the power source 422 to generate an electric field in the process volume 412. For example, a power density of about 0.2 watts/cm2 or larger, such as between about 0.2 watts/cm$^2$ to about 0.8 watt/cm$^2$, or about 0.45 watts/cm$^2$, can be used to be compatible with a low temperature substrate deposition method of the invention. The power source 422 and matching network (not shown) create and sustain a plasma of the process gases from the precursor gases in the process volume 412. Preferably high frequency RF power of 13.56

MHz can be used, but this is not critical and lower frequencies can also be used. Further, the walls of the chamber can be protected by covering with a ceramic material or anodized aluminum material.

Generally, the support assembly 438 has a lower side 426 and an upper side 434, supporting the substrate 440. The lower side 426 has a stem 442 coupled thereto and connected to a lift system (not shown) for moving the support assembly 438 between an elevated processing position (as shown) and a lowered substrate transfer position. The stem 442 additionally provides a conduit for electrical and thermocouple leads between the support assembly 438 and other components of the system 400. A bellows 446 is coupled to the substrate support assembly 438 to provide a vacuum seal between the process volume 412 and the atmosphere outside the processing chamber 402 and facilitate vertical movement of the support assembly 438.

In one embodiment, the lift system is adjusted such that a spacing between the substrate and the gas distribution plate assembly 418 is about 400 mils or larger, such as between about 400 mils to about 1600 mils, e.g., about 900 mils, during processing. The ability to adjust the spacing enables the process to be optimized over a wide range of deposition conditions, while maintaining the required film uniformity over the area of a large substrate. The combination of a grounded substrate support assembly, a ceramic liner, high pressures and close spacing gives a high degree of plasma confinement between the gas distribution plate assembly 418 and the substrate support assembly 438, thereby increasing the concentration of reactive species and the deposition rate of the subject thin films.

The support assembly 438 additionally supports a circumscribing shadow frame 448. Generally, the shadow frame 448 prevents deposition at the edge of the substrate 440 and support assembly 438 so that the substrate does not stick to the support assembly 438. The lid assembly 410 typically includes an entry port 480 through which process gases provided by the gas source 404 are introduced into the processing chamber 402. The entry port 480 is also coupled to a cleaning source 482. The cleaning source 482 typically provides a cleaning agent, such as disassociated fluorine, that is introduced into the processing chamber 402 to remove deposition by-products and films from processing chamber hardware, including the gas distribution plate assembly 418.

The gas distribution plate assembly 418 is typically configured to substantially follow the profile of the substrate 440, for example, polygonal for large area substrates and circular for wafers. The gas distribution plate assembly 418 includes a perforated area 416 through which precursors and other gases, such as hydrogen gas, supplied from the gas source 404 are delivered to the process volume 412. The perforated area 416 is configured to provide uniform distribution of gases passing through the gas distribution plate assembly 418 into the processing chamber 402. The gas distribution plate assembly 418 typically includes a diffuser plate 458 suspended from a hanger plate 460. A plurality of gas passages 462 are formed through the diffuser plate 458 to allow a predetermined distribution of gas passing through the gas distribution plate assembly 418 and into the process volume 412.

Gas distribution plates that may be adapted to benefit from the invention are described in commonly assigned U.S. patent application Ser. No. 09/922,219, filed Aug. 8, 2001 by Keller et al.; Ser. No. 10/140,324, filed May 6, 2002; and Ser. No. 10/337,483, filed Jan. 7, 2003 by Blonigan et al.; U.S. Pat. No. 6,477,980, issued Nov. 12, 2002 to White et al.; and U.S. patent application Ser. No. 10/417,592, filed Apr. 16, 2003 by Choi et al., which are hereby incorporated by reference in their entireties. Although the invention has been described in accordance with certain embodiments and examples, the invention is not meant to be limited thereto. The CVD process herein can be carried out using other CVD chambers, adjusting the gas flow rates, pressure, plasma density, and temperature so as to obtain high quality films at practical deposition rates.

EXAMPLES

The invention describes a method of depositing a carbon-containing material layer at a low temperature, such as about 200° C. or lower, onto a large area substrate surface. The invention overcomes the low light transmittance observed at lower wavelengths of between 430 nm and 570 nm as shown in FIG. 2 for a various film thicknesses and provides increased light transmittance of the carbon-containing material layer to about 80% or higher, such as about 90% or higher, about 95% or higher, or about 97% or higher, at all wavelengths in the visible light spectrum. The light transmittance of a carbon-containing material layer without the modification using methods of the invention may become worse when the film gets thicker, as shown in FIG. 2, having a thickness of 0.8 microns, 1.5 microns, 2 microns, and 3.2 microns for line 210, 220, 230, and 240, respectively, where light transmittance were lower as the film get thicker.

Figure 7:
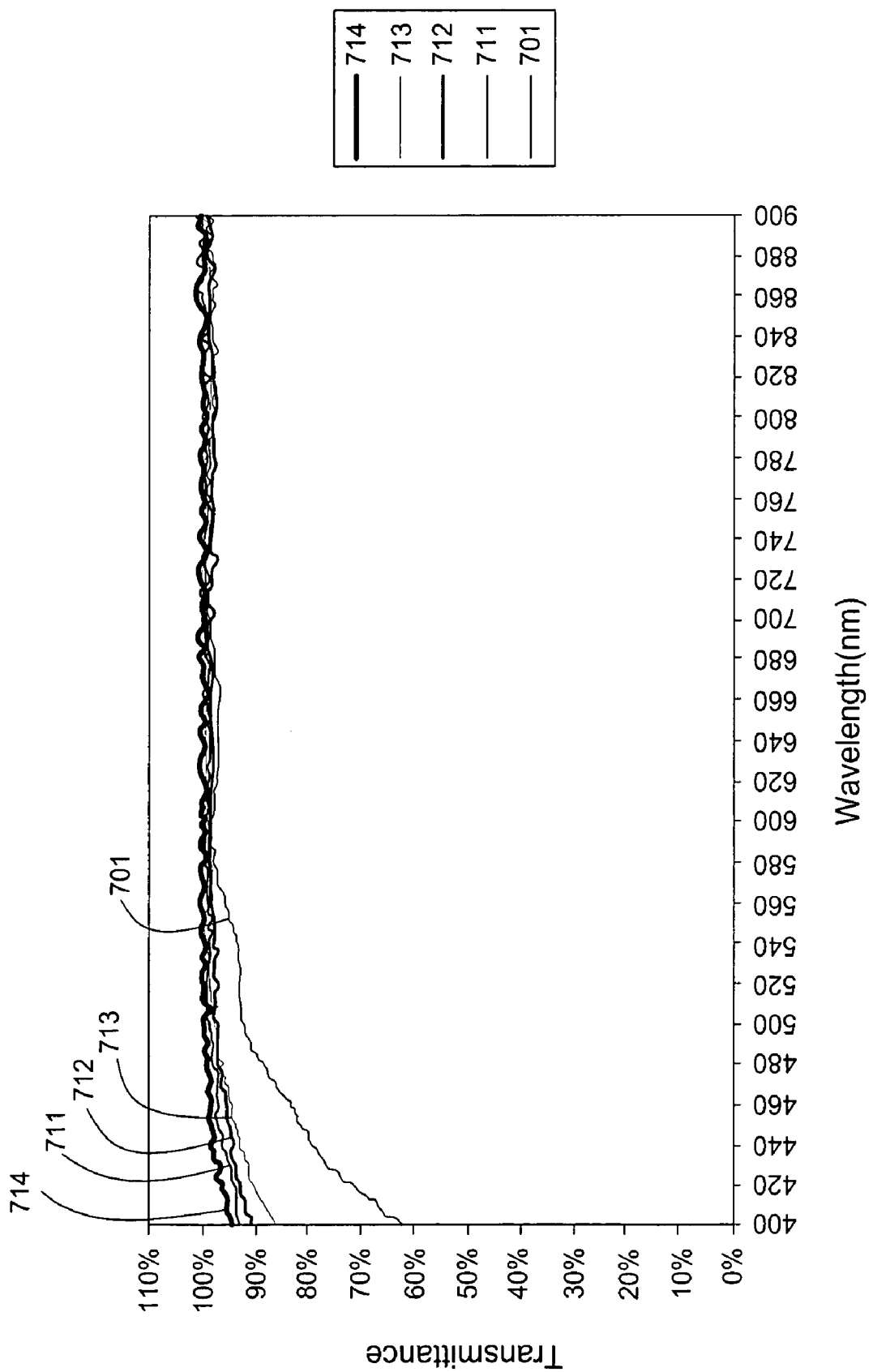
FIG. 7 is a graph showing improved light transmittance at different wavelengths of the visible light for exemplary carbon-containing material layers deposited using methods of the invention.

FIG. 7 is a graph for the results of the measured transmittance of several exemplary carbon-containing material films, showing improved light transmittance at different wavelengths in a visible light spectrum. The exemplary films are amorphous carbon films deposited using methods of the invention. A mixture of precursors includes acetylene, nitrogen gas, and hydrogen gas for example 701. In example 711, a mixture of precursors includes acetylene, silane, nitrogen gas, and hydrogen gas. In example 712, a mixture of precursors includes acetylene, silane, ammonia, nitrogen gas, and hydrogen gas. In example 713, a mixture of precursors includes acetylene, silane, ammonia, and hydrogen gas. In example 714, a mixture of precursors includes acetylene, silane, ammonia, nitrogen gas, and hydrogen gas.

The precursors can be delivered into the same PECVD process chamber at a flow rate of between about 100 sccm to about 500 sccm for acetylene, a flow rate of between about 10 sccm to about 300 sccm for silane, a flow rate of between about 300 sccm to about 2000 sccm for ammonia, a flow rate of between about 300 sccm to about 2500 sccm for nitrogen gas, and a flow rate of between about 200 sccm to about 800 sccm for hydrogen gas. The substrate was placed into the PECVD process chamber at a spacing of about 900 mils and a pressure of about 1.5 Torr was maintained. A plasma was applied from a RF power density of about 0.25 watts/cm$^2$ for a deposition time period of about 400 seconds in the presence of a substrate bias. A substrate temperature of about 100° C. is maintained during deposition, resulting in a deposition rate of about 1,600 angstroms/min.

The light transmittance measurement of the deposited films of the examples 701, 711, 712, 713, 714 are shown in FIG. 7 and exemplified in Table 2. Overall, the transmittance of all the exemplary amorphous carbon films at different wavelengths is very high. The examples 711, 712, 713, 714 demonstrates improved transmittance to about 80% or higher, such as about 90% or higher or 95% or higher, at the respective wavelengths, when a silicon-containing compound and a nitrogen-containing compound is present in the mixture of the precursors. The improved transmittance is most dramatic at the lower wavelengths, such as at the wavelengths from 400 nm to 560 nm as shown in FIG. 7 and Table 2. The results suggest that the amorphous carbon films of the invention can also be used in a variety of applications, including top or bottom emissive display devices.

TABLE 2

Comparison of light transmittance

| Transmittance % in the Examples at different wavelengths | 430 nm | 500 nm | 600 nm | 700 nm |
|---|---|---|---|---|
| 701 | 77% | 92% | 98% | 99% |
| 711 | 95% | 99% | 100% | 100% |
| 712 | 94% | 98% | 98% | 99% |
| 713 | 97% | 99% | 100% | 99% |
| 714 | 91% | 97% | 99% | 99% |

The invention also provides various encapsulating films having one layer, two layers, three layers, four layers, or five layers of amorphous carbon material in between two layers, three layers, four layers, five layers or six layers, respectively, of silicon nitride material and the films were deposited and compared/tested. In addition, the silicon-containing inorganic barrier layers and the amorphous carbon layers deposited at various thickness or in the presence and absence of a hydrogen source gas were also tested.

The encapsulating films of the invention, having the silicon-containing inorganic barrier layers and the amorphous carbon layers, were tested using a scotch tape peeling test and a calcium test. The results were very good, showing no peeling of the various multilayer encapsulating films from the substrate and no or low level of water and oxygen corrosion (no or low level of transparent calcium salt formation in a calcium test). The encapsulating films of the invention were also tested on devices, such as OLED devices, for their ability to be deposited to a desired thickness without peeling off the surface of the devices and prevent water and oxygen being penetrated into the devices and lengthening the device lifetime. When tested under about 60° C. and at high humidity of about 85%, the encapsulating films of the invention can lengthen the lifetime of the devices to be more than about 1440 hours.

Figure 8:
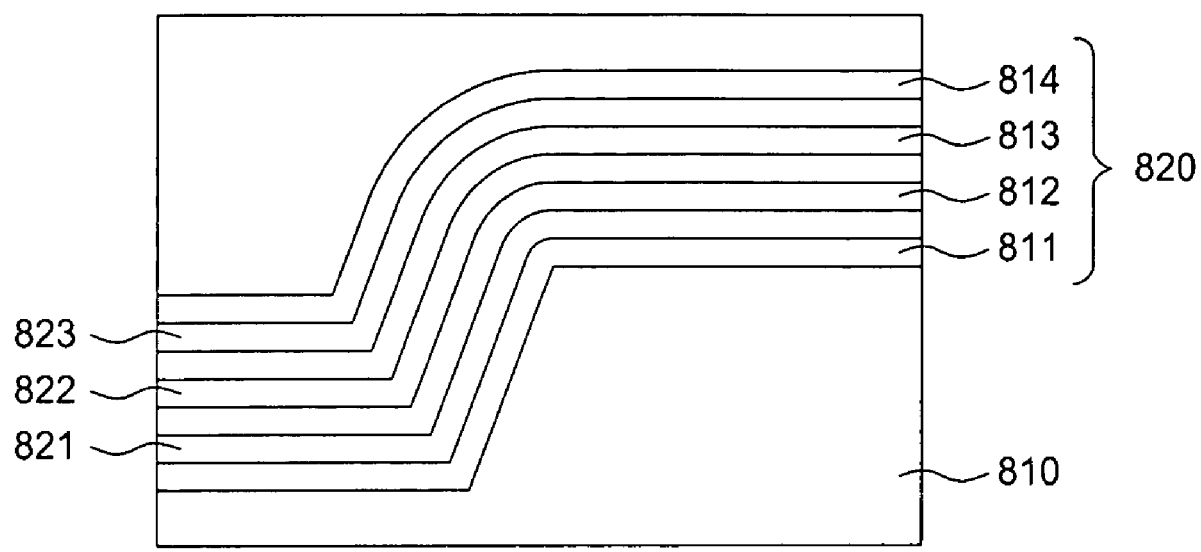
FIG. 8 illustrates one exemplary multilayer encapsulating film having four layers of silicon nitride inorganic barrier films and three layers of amorphous carbon films deposited by methods of the invention.

FIG. 8 is a representative showing of a cross sectional scanning electron microscopy micrograph of a substrate 810 with a multilayer encapsulating film 820 deposited on top. The multilayer encapsulating film 820 includes four layers of silicon nitride inorganic barrier films and three layers of amorphous carbon films deposited by methods of the invention. The multilayer encapsulating film 820 of the invention include four layers of a silicon nitride barrier material 811, 812, 813, 814 and three layers of an amorphous carbon material 821, 822, 823 in between the silicon nitride material to promote the adhesion of silicon nitride material, making a final thickness of the multilayer encapsulating film 820 to be about 35,000 angstroms. The overall step coverage of the multilayer encapsulating film 820 with a total of nine deposited material layers is very good, about 95% step coverage obtained.

Deposition of the amorphous carbon films is described above. The exemplary barrier layer is a silicon nitride layer deposited by a mixture of silane, ammonia, nitrogen gas, and hydrogen gas, delivered at about 150 sccm, about 400 sccm, about 1,500 sccm, and about 4,000 sccm, respectively, into a PECVD process chamber. The substrate was placed into the PECVD process chamber at a spacing of about 900 mils and a pressure of about 2.1 Torr was maintained. A plasma was applied from a RF power density of about 0.45 watts/$cm^2$ for a deposition time period of about 390 seconds in the presence of a substrate bias. A substrate temperature of about 70° C. is maintained during deposition, resulting in a deposition rate of about 1,700 Å/min.

While the foregoing is directed to embodiments of the present invention, other and further embodiments of the invention may be devised without departing from the basic scope thereof, and the scope thereof is determined by the claims that follow.

The invention claimed is:

1. A method for forming a multilayer encapsulating film onto a substrate placed in a substrate processing system, comprising:
    depositing a plurality of silicon-containing inorganic barrier layers onto the surface of the substrate, comprising delivering a first silicon-containing compound into the substrate processing system; and
    depositing one or more carbon-containing material layers in between the one or more silicon-containing inorganic barrier layers at a substrate temperature of about 200° C. or lower, comprising delivering a mixture of precursors comprising a carbon-containing compound, a second silicon-containing compound, and a nitrogen-containing compound into the substrate processing system.

2. The method of claim 1, wherein the transmittance of the one or more carbon-containing material layers is about 80% or higher at wavelengths between 400 nm and 900 nm.

3. The method of claim 1, wherein the transmittance of the one or more carbon-containing material layers is about 90% or higher at wavelengths between 400 nm and 900 nm.

4. The method of claim 1, wherein the transmittance of the one or more carbon-containing material layers is about 95% or higher at wavelengths between 400 nm and 900 nm.

5. The method of claim 1, wherein the transmittance of the one or more carbon-containing material layers is about 97% or higher at wavelengths between 400 nm and 900 nm.

6. The method of claim 1, wherein the one or more carbon-containing material layers are deposited at a substrate temperature from about 20° C. to about 150° C.

7. The method of claim 1, wherein the plurality of silicon-containing inorganic barrier layers comprise a material selected from the group consisting of silicon nitride, silicon oxynitride, silicon oxide, silicon carbide, and combinations thereof.

8. The method of claim 1, wherein the one or more carbon-containing material layers comprise a material selected from the group consisting of amorphous carbon, silicon-doped carbon material, diamond-like carbon, and combinations thereof.

9. The method of claim 1, wherein the carbon-containing compound comprises a compound selected from the group consisting of acetylene ($C_2H_2$), ethane ($C_2H_6$), ethene ($C_2H_4$), methane ($CH_4$), propylene ($C_3H_6$), propyne ($C_3H_4$), propane ($C_3H_8$), butane ($C_4H_{10}$), butylene ($C_4H_8$), butadiene ($C_4H_6$), benzene ($C_6H_6$), toluene ($C_7H_8$), and combinations thereof.

10. The method of claim 1, wherein the second silicon-containing compound comprises a compound selected from the group consisting of silane, $SiF_4$, $Si_2H_6$, and combinations thereof.

11. The method of claim 1, wherein the nitrogen-containing compound comprises a compound selected from the group consisting of ammonia ($NH_3$), nitrous oxide ($N_2O$), nitric oxide (NO), nitrogen gas ($N_2$) and combinations thereof.

12. The method of claim 1, wherein the mixture of precursors further comprises a hydrogen gas.

13. The method of claim 1, wherein the mixture of precursors comprises acetylene, hydrogen gas, silane, and ammonia.

14. The method of claim 1, wherein the mixture of precursors comprises acetylene, hydrogen gas, silane, and nitrogen gas.

15. The method of claim 1, wherein the mixture of precursors comprises acetylene, hydrogen gas, silane ($SiH_4$), ammonia ($NH_3$), and nitrogen gas ($N_2$).

16. The method of claim 1, wherein the one or more silicon-containing inorganic barrier layers and the one or more carbon-containing material layers are deposited in a single process chamber inside the substrate processing system.

17. A method for forming an amorphous carbon layer in a multilayer encapsulating film over a substrate within a substrate processing system, comprising:
   delivering a hydrocarbon-containing precursor for the amorphous carbon layer;
   delivering a hydrogen gas adapted to improve the film uniformity of the amorphous carbon layer into the substrate processing system;
   delivering a silicon-containing precursor and a nitrogen-containing precursor adapted to improve the light transmittance of the amorphous carbon layer to about 80% or higher at all wavelengths of a visible light spectrum into the substrate processing system;
   controlling the temperature of the substrate to a temperature of about 150° C. or lower;
   generating a plasma to deposit the amorphous carbon layer on the surface of the substrate; and
   depositing the amorphous carbon layer onto the substrate until a desired thickness of the amorphous carbon layer is obtained.

18. The method of claim 17, wherein the light transmittance of the amorphous carbon layer is about 90% or higher at wavelengths between 400 nm and 900 nm.

19. The method of claim 17, wherein the light transmittance of the amorphous carbon layer is about 95% or higher at wavelengths between 400 nm and 900 nm.

20. The method of claim 17, wherein the light transmittance of the amorphous carbon layers is about 97% or higher at wavelengths between 400 nm and 900 nm.

21. The method of claim 17, wherein the amorphous carbon layer is deposited at a substrate temperature from about 20° C. to about 100° C.

22. The method of claim 17, wherein the silicon-containing precursor comprises a compound selected from the group consisting of silane, $SIF_4$, $SI_2H_6$, and combinations thereof.

23. The method of claim 17, wherein the nitrogen-containing precursor comprises a compound selected from the group consisting of ammonia ($NH_3$), nitrous oxide ($N_2O$), nitric oxide (NO), nitrogen gas ($N_2$) and combinations thereof.

24. The method of claim 17, wherein the nitrogen-containing precursor comprises ammonia ($NH_3$) and nitrogen gas ($N_2$).

25. The method of claim 17, wherein the hydrocarbon-containing precursor comprises a compound selected from the group consisting of acetylene ($C_2H_2$), ethane ($C_2H_6$), ethene ($C_2H_4$), methane ($CH_4$), propylene ($C_3H_6$), propyne ($C_3H_4$), propane ($C_3H_8$), butane ($C_4H_{10}$), butylene ($C_4H_8$), butadiene ($C_4H_6$), benzene ($C_6H_6$), toluene ($C_7H_8$), and combinations thereof.

26. A method for depositing an encapsulating layer, having one or more layers of silicon-containing inorganic barrier materials and carbon-containing materials, onto a substrate in a substrate processing system, comprising:
   delivering a first mixture of precursors for a silicon-containing Inorganic barrier layer and delivering a hydrogen gas into the substrate processing system;
   controlling the temperature of the substrate to a temperature of about 150° C. or lower;
   generating a plasma to deposit the silicon-containing inorganic barrier layer on the surface of the substrate;
   delivering a second mixture of precursors for a carbon-containing material layer and delivering a hydrogen gas into the substrate processing system, the second mixture of precursors comprising a hydrocarbon-containing precursor, a silicon-containing containing precursor, and a nitrogen-containing precursor;
   controlling the temperature of the substrate to a temperature of about 150° C. or lower;
   generating a plasma to deposit the carbon-containing material layer onto the surface of the silicon-containing inorganic barrier layer; and
   depositing the encapsulating layer onto the substrate by repeating the above mentioned steps until a thickness of the encapsulating layer of about 15,000 angstroms or more is obtained.

27. The method of claim 26, wherein the carbon-containing material layer comprises a material selected from the group consisting of amorphous carbon, silicon-doped carbon material, diamond-like carbon, and combinations thereof.

28. The method of claim 26, wherein a silicon-containing inorganic barrier layer is deposited on the surface of the substrate as the last material layer of the encapsulating layer.

29. The method of claim 26, wherein the silicon-containing inorganic barrier layer and the carbon-containing material layer are deposited in a single process chamber inside the substrate processing system.

30. A method for forming an amorphous carbon layer in a multilayer encapsulating film over a substrate within a substrate processing system, comprising:
   delivering a hydrocarbon-containing precursor at a first flow rate for the amorphous carbon layer;
   delivering a hydrogen gas adapted to improve the film uniformity of the amorphous carbon layer into the substrate processing system;
   delivering a silicon-containing precursor at a second flow rate and a nitrogen-containing precursor at a third flow rate into the substrate processing system;
   controlling the temperature of the substrate to a temperature of about 150° C. or lower; and
   generating a plasma inside the substrate processing system for a time period to deposit the amorphous carbon layer on the surface of the substrate, wherein the ratio of the first flow rate and the second flow rate is 4:1 or larger.

31. The method of claim 30, wherein the light transmittance of the amorphous carbon layer is about 80% or higher at wavelengths between 400 nm end 900 nm.

32. The method of claim 30, wherein the light transmittance of the amorphous carbon layer is about 90% or higher at wavelengths between 400 nm and 900 nm.

33. The method of claim 30, wherein the light transmittance of the amorphous carbon layer is about 95% or higher at wavelengths between 400 nm and 900 nm.

34. The method of claim 30, wherein the transmittance of the one or more carbon-containing material layers is about 97% or higher at wavelengths between 400 nm and 900 nm.

35. The method of claim 30, wherein the amorphous carbon layer is deposited at a substrate temperature from about 20° C. to about 100° C.

* * * * *

UNITED STATES PATENT AND TRADEMARK OFFICE
CERTIFICATE OF CORRECTION

PATENT NO. : 7,214,600 B2  
APPLICATION NO. : 11/229015  
DATED : May 8, 2007  
INVENTOR(S) : Won et al.

Page 1 of 1

It is certified that error appears in the above-identified patent and that said Letters Patent is hereby corrected as shown below:

In Column 1, Line 9, please delete "performance" and insert --Performance--;

In Column 7, Line 52, please delete "form" and insert --from--;

In Column 10, Line 13, please delete "A" and insert --An--;

In Column 10, Line 22-23, please delete "(PET) or polyethyleneterephthalate (PEN)." and insert --(PET).--;

In Column 11, Line 59, please delete "is" and --are-;

In Column 12, Line 20, please delete "generally" and insert --general--;

In Column 17, Line 45-46, please delete "is deposited is deposited" and insert --is deposited--;

In Column 20, Line 28, please delete "were" and insert --was--;

In Column 20, Line 28, please delete "get" and insert --gets--;

In Column 23, Claim 22, Line 56, please delete "SIF$_4$" and insert --SiF$_4$--;

In Column 23, Claim 22, Line 56, please delete "SI$_2$H$_6$" and insert --Si$_2$H$_6$--;

In Column 24, Claim 26, Line 11, please delete "Inorganic" and insert --inorganic--;

In Column 24, Claim 31, Line 67, please delete "end" and insert --and--.

Signed and Sealed this

Seventh Day of August, 2007

JON W. DUDAS  
*Director of the United States Patent and Trademark Office*